(12) United States Patent
Schoedel

(10) Patent No.: US 12,384,248 B2
(45) Date of Patent: Aug. 12, 2025

(54) METHOD FOR CONTROLLING A MOTOR-DRIVEN FLAP ASSEMBLY OF A MOTOR VEHICLE

(71) Applicant: Brose Fahrzeugteile GmbH SE & Co. Kommanditgesellschaft, Bamberg, Bamberg (DE)

(72) Inventor: Sebastian Schoedel, Eckersdorf (DE)

(73) Assignee: Brose Fahrzeugteile SE & Co. Kommanditgesellschaft, Bamberg, Bamberg (DE)

( * ) Notice: Subject to any disclaimer, the term of this patent is extended or adjusted under 35 U.S.C. 154(b) by 197 days.

(21) Appl. No.: 18/278,524

(22) PCT Filed: Feb. 22, 2022

(86) PCT No.: PCT/EP2022/054309
§ 371 (c)(1),
(2) Date: Aug. 23, 2023

(87) PCT Pub. No.: WO2022/179999
PCT Pub. Date: Sep. 1, 2022

(65) Prior Publication Data
US 2024/0051396 A1  Feb. 15, 2024

(30) Foreign Application Priority Data
Feb. 23, 2021  (DE) .................... 10 2021 104 283.6

(51) Int. Cl.
*B60L 1/00* (2006.01)
*B60J 5/10* (2006.01)
(Continued)

(52) U.S. Cl.
CPC ............. *B60L 1/003* (2013.01); *B60J 5/101* (2013.01); *B60L 53/11* (2019.02); *B60L 53/66* (2019.02);
(Continued)

(58) Field of Classification Search
CPC .......... B60L 1/003; B60L 53/11; B60L 53/66; B60L 58/12; B60L 2270/147; B60J 5/101;
(Continued)

(56) References Cited

U.S. PATENT DOCUMENTS 9,637,049 B2    5/2017 Russ et al.
2018/0248545 A1 8/2018 Bar et al.
(Continued)

FOREIGN PATENT DOCUMENTS

DE    102017129151 W    6/2019
DE    102019108693 W    10/2020
WO    2022179999 W      9/2022

OTHER PUBLICATIONS

"German Search Report," for German Patent Application No. 102021104283.6 mailed Nov. 10, 2021 (8 pages), no translation.
(Continued)

*Primary Examiner* — Abby J Flynn
*Assistant Examiner* — Kyle J Kingsland
(74) *Attorney, Agent, or Firm* — Pauly, DeVries Smith & Deffner LLC

(57) ABSTRACT

A method for actuating a motor-driven flap assembly of a vehicle. A control assembly is provided for actuating a motor drive assembly which is paired with the flap assembly, and a distance sensor which is coupled to the control assembly is also provided. Sensor signals are detected by the distance sensor in order to detect an operator action carried out by an operator of the vehicle, wherein the sensor signals are analyzed by the control assembly in an analysis routine in order to detect a specified operator action, and the chive assembly is actuated by the control assembly upon detecting the specified operator action. In some embodiments, when a specified charging criterion is satisfied, the analysis routine (Continued)

is carried out by the control assembly in a specified charging mode, in which the analysis of the sensor signals is modified on the basis of an analysis during a normal operation.

20 Claims, 2 Drawing Sheets

(51) Int. Cl.
*B60L 53/10* (2019.01)
*B60L 53/66* (2019.01)
*B60L 58/12* (2019.01)
*E05F 15/73* (2015.01)

(52) U.S. Cl.
CPC .............. *B60L 58/12* (2019.02); *E05F 15/73* (2015.01); *E05Y 2400/858* (2013.01); *E05Y 2900/54* (2013.01)

(58) Field of Classification Search
CPC ............... E05F 15/73; E05Y 2400/858; E05Y 2900/54; E05Y 2900/546; H03K 2217/960705; H03K 2217/96078; H03K 17/955
See application file for complete search history.

(56) References Cited

U.S. PATENT DOCUMENTS

| 2021/0237712 | A1 | 8/2021 | Fuchs et al. |
| 2021/0254391 | A1 | 8/2021 | Sieg et al. |
| 2022/0290484 | A1* | 9/2022 | Salter ...................... B60J 5/047 |

OTHER PUBLICATIONS

"International Search Report and Written Opinion," for PCT Application No. PCT/EP2021/084311 mailed Jun. 8, 2022 (12 pages), no translation.

* cited by examiner

METHOD FOR CONTROLLING A MOTOR-DRIVEN FLAP ASSEMBLY OF A MOTOR VEHICLE

CROSS-REFERENCE TO RELATED APPLICATIONS

This application is a national stage application under 35 U.S.C. 371 of International Patent Application Serial No. PCT/EP2022/054309, entitled "Method for Controlling a Motor-Driven Flap Assembly of a Motor Vehicle," filed Feb. 22, 2022, which claims priority from German Patent Application No. DE 10 2021 104 283.6, filed Feb. 23, 2021, the disclosure of which is incorporated herein by reference.

FIELD OF THE TECHNOLOGY

Various embodiments relate to a method for activating a motor-driven hatch arrangement of a motor vehicle, to a control arrangement for implementing such a method, and also to a hatch arrangement with such a control arrangement.

BACKGROUND

The hatch arrangement in question exhibits a hatch. The hatch may be any closure element of a motor vehicle. Such elements include tailgates, trunk lids, front hoods, in particular engine hoods, doors, in particular side doors or rear doors, or such like. The hatch may have been arranged on the body of the motor vehicle so as to be capable of swiveling or being longitudinally displaced.

In the known method (DE 10 2017 129 151 A1), which some embodiments take as their starting-point, the operational control of the hatch arrangement is provided by a specified operator action in the form of an operator gesture. The operator gesture is, for instance, a predefined foot movement of the operator. For this purpose, operator movements are captured by means of a distance sensor. A control arrangement undertakes an evaluation of the sensor signals captured by means of the distance sensor. Upon detection of the predefined foot movement on the basis of the sensor data, an activation of the hatch arrangement occurs, in particular a motor-driven opening of the assigned hatch.

In principle, with a view to avoiding an erroneous triggering of the motor-driven adjustment, a preprocessing of the sensor signals can be carried out, with which any possible periodic interfering signals are reduced via preliminary filters. In this case, the focus is on lessening interfering influences on the detection of the operator action, so that even comparatively strong interfering signals do not result in an unintentional triggering of the motor-driven adjustment. Relevant here are, in particular, interfering signals in the vicinity of radio transmitters such as broadcasting masts and such like, the operation of which has a considerable influence on the sensor signals of the distance sensors.

One challenge, however, continues to consist in the fact that, especially in the field of electric vehicles with the more powerful electronics employed therein, interfering influences on distance sensors may generally result in further operational impairments.

SUMMARY

The problem underlying some embodiments is to configure and develop the known method in such a manner that the reliability of the detection of the operator action is further ensured.

In the case of various embodiments provided herein, the above problem is solved by the features described herein.

The insight underlying some embodiments is that in the field of electric vehicles considerable interfering influences on distance sensors arise in the course of a process of charging of the energy-storage device provided for the electric traction drive.

Essential is the idea that, in principle, the risk of erroneous triggering events can be reduced through the application, mentioned in the introduction, of preliminary filters. On the other hand, especially in the case of the DC charging stations provided for fast charging of the energy-storage device, the interfering influences may result in operating actions carried out by the operator no longer being detected on the basis of the sensor signals, so that in some situations the motor-driven adjustment can no longer be triggered reliably.

In detail, it is proposed that in the case where a specified charging criterion is satisfied that represents a process, external to the vehicle, of charging of the energy-storage device, the evaluation routine is carried out in a specified charging mode in which the evaluation of the sensor signals is modified, proceeding from an evaluation according to normal operation.

With the proposed solution, the effect of the interfering influence within the charging process can consequently be purposefully reduced, in order to enhance the reliability of the detection of the operator action.

Different variants are conceivable for the purpose of amending the evaluation with regard to the interfering influence on the sensor signals within the charging process. In various embodiments, the evaluation of the sensor signals in the charging mode is carried out in the evaluation routine by applying to the sensor signals a filter that has been specified for suppressing the interfering influence. In this case, this filter may have been specifically configured for the presence of a charging process and with the charging mode may to a certain extent be added on to the evaluation of the sensor signals. The detection of the operator action is effected in respect of the sensor signals filtered in such a manner.

In various embodiments, there is provision that the specified charging criterion represents a characteristic temporal progression of an interfering influence of the external charging process on the sensor signals, and that the temporal progression of the sensor signals is monitored for compliance with the charging criterion by means of the control arrangement. An aspect in this case is that a process of charging of the energy-storage device can be detected from a characteristic temporal progression of the sensor signals themselves, for instance from a temporal sequence of interfering signals caused by the charging station, or such like. Accordingly, a charging process can be easily identified by means of the control arrangement with control-engineering means.

Various embodiments relate to configurations of the charging criterion provided for the purpose of detecting the charging process, which may include subcriteria relating, in particular, to amplitude values and frequency values.

In various embodiments, the filter that has been specified for suppressing the interfering influence is specified to be dependent on the temporal progression of the sensor signals when the charging criterion is satisfied. For instance, not only is the temporal progression that is characteristic of the charging process therefore utilized for the purpose of detecting the charging process as such, but the filter can be specifically adapted to the interfering influence of the respective charging process. A particularly operationally reliable variant in this case is a specification of the filter on the basis of a classification of the charging process.

In various embodiments, the filter that has been specified for suppressing the interfering influence can bring about a suppression of the interfering influence for sensor signals in a manner contingent upon a statistical quantity such as the variance. Hence the temporal progression of the sensor signals can, for instance, be purposefully smoothed outside the range of the operator actions.

Furthermore, as provided in various embodiments, an advantageous configuration consists in the fact that a detection criterion employed in the evaluation routine is modified in the charging mode, in order to guarantee a reliable detection of the operator action. The adaptation of the detection criterion can be effected independently of, or in addition to, the application of the aforementioned filter in the charging mode.

Conceivable, in addition, is a detection of a charging process via a control unit of the motor vehicle, for instance via a communication with the charging station, this being taken into consideration in the configuration as provided herein. In this case, the charging criterion may be defined by the condition that the state-of-charge signal is present.

According to various embodiments, the aforementioned control arrangement, which has been set up for the implementation of the method according to the proposal, is provided as such. Reference is made to all the statements relating to the method according to the proposal.

According various embodiments, the aforementioned hatch arrangement, which underlies the implementation of the method according to the proposal, is provided as such. In this respect, too, reference is made to the statements relating to the method according to the proposal.

Various embodiments provide a method for activating a motor-driven hatch arrangement of a motor vehicle, wherein the motor vehicle is equipped with a central, rechargeable electrical energy-storage device, such as for supplying an electric traction drive with power, wherein a control arrangement, for activating a motor-driven drive arrangement assigned to the hatch arrangement, and a distance sensor, coupled with the control arrangement, are provided, wherein sensor signals are captured by means of the distance sensor for the purpose of detecting an operator action executed by an operator of the motor vehicle, wherein the sensor signals are evaluated in an evaluation routine by means of the control arrangement for the purpose of detecting a specified operator action, and upon detection of the specified operator action the drive arrangement is activated by means of the control arrangement, wherein when a specified charging criterion, which represents a process of charging, external to the motor vehicle, of the energy-storage device, is satisfied, the evaluation routine is carried out by means of the control arrangement in a specified charging mode in which the evaluation of the sensor signals is modified, proceeding from an evaluation according to normal operation.

In various embodiments, the evaluation of the sensor signals in the charging mode is carried out in the evaluation routine by applying to the sensor signals a filter that has been specified for suppressing the interfering influence, such as in that the filter that can have been specified for suppressing the interfering influence is provided in combination, in particular in cascaded manner, with at least one preliminary filter provided in accordance with normal operation, and/or with modification of a preliminary filter.

In various embodiments, the specified charging criterion represents a characteristic temporal progression of an interfering influence of the external charging process on the sensor signals, and in that by means of the control arrangement the temporal progression of the sensor signals is monitored for compliance with the charging criterion.

In various embodiments, the charging criterion includes at least one subcriterion directed toward an amplitude value of the temporal progression of the sensor signals and/or at least one subcriterion directed toward a frequency value of the temporal progression of the sensor signals.

In various embodiments, a subcriterion directed toward the amplitude value relates to an average value, in particular a moving average, of the temporal progression of the sensor signals, such as in that this subcriterion can be defined by the condition that the average value of the temporal progression of the sensor signals exceeds a specified temporal offset.

In various embodiments, the transfer function of the filter that has been specified for suppressing the interfering influence is specified by means of the control arrangement in a manner contingent upon the temporal progression of the sensor signals when the charging criterion is satisfied, such as in that the transfer function can be specified in a manner contingent upon the compliance with the subcriterion directed toward an amplitude value and/or frequency value of the temporal progression of the sensor signals.

In various embodiments, the filter that has been specified for suppressing the interfering influence brings about a suppression of the interfering influence for sensor signals in a manner contingent upon a statistical quantity, in particular the temporal variance, of the sensor signals that is characteristic of the operator action, such as in that the specified filter can bring about a suppression of the interfering influence for sensor signals having a statistical quantity, in particular the temporal variance, below a specified threshold value.

In various embodiments, in the evaluation routine the sensor signals are monitored for compliance with a specified detection criterion for the purpose of detecting the specified operator action, and upon compliance with the detection criterion the specified operator action is deemed to be detected, and in that the detection criterion is modified in the charging mode, proceeding from a detection criterion according to normal operation.

In various embodiments, by means of the control arrangement the charging process is classified on the basis of the temporal progression of the sensor signals when the charging criterion is satisfied, and in that the evaluation of the sensor signals in the charging mode is amended in a manner contingent upon the classification of the charging process, such as in that the filter that can have been specified for suppressing the interfering influence is specified in a manner contingent upon the classification.

In various embodiments, with the external process of charging of the control arrangement a state-of-charge signal is communicated by means of a control unit of the motor vehicle, such as by means of the central control system of the motor vehicle, and wherein the charging criterion is defined at least partially by the condition that the state-of-charge signal is available to the control arrangement.

In various embodiments, the external charging process is carried out by means of a DC charging station.

In various embodiments, with the motor-driven adjustment of the hatch arrangement a transfer of the hatch arrangement between a closed position and an open position is carried out.

Various embodiments provide a control arrangement for implementing a method as described herein.

Various embodiments provide a hatch arrangement with a hatch, the hatch arrangement exhibiting a drive arrangement and a control arrangement as described herein.

BRIEF DESCRIPTION OF THE DRAWINGS

In the following, various aspects will be elucidated in more detail on the basis of a drawing representing merely an embodiment. In the drawing.

DETAILED DESCRIPTION

Figure 1:
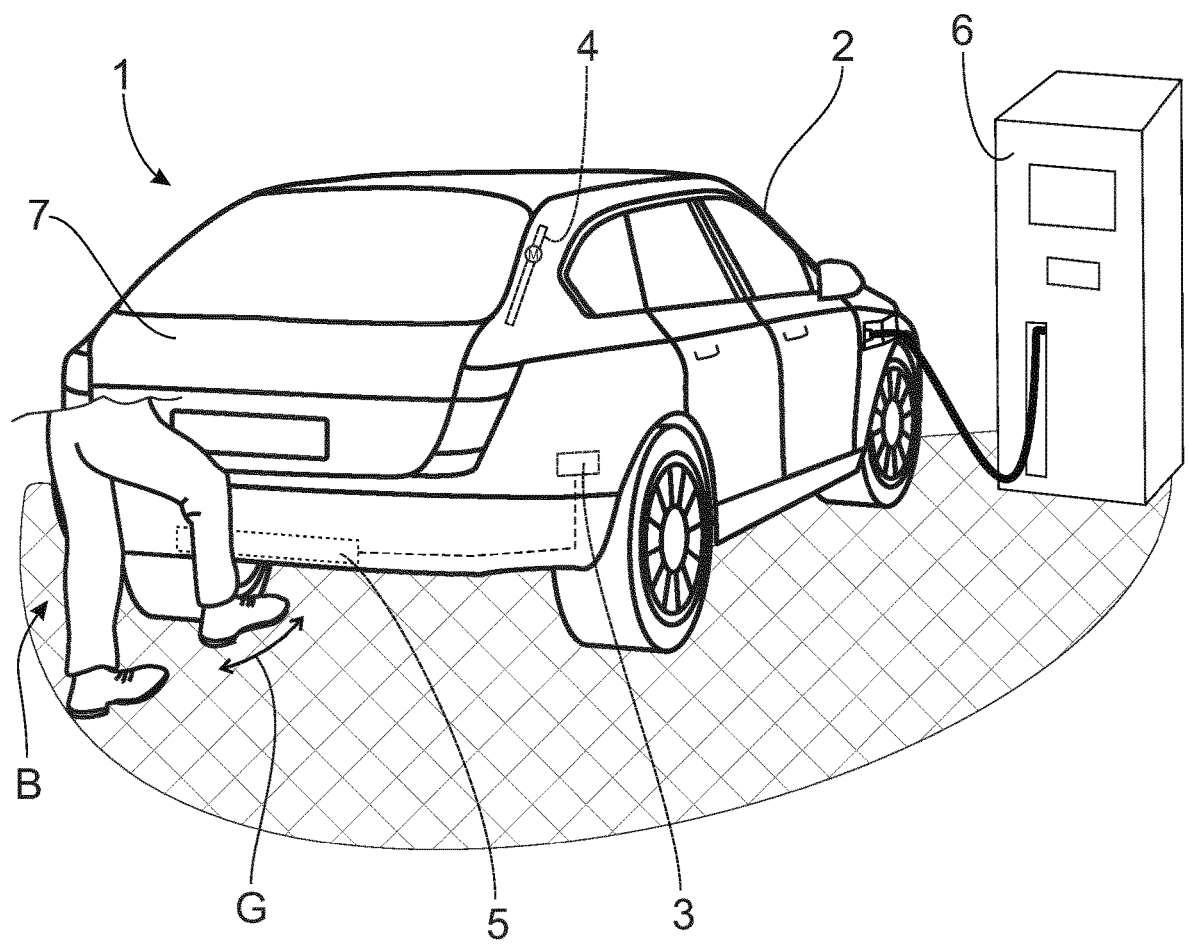
FIG. 1 shows a motor vehicle with a hatch arrangement according to the proposal for implementing the method according to the proposal.

The method according to the proposal relates to the operation of a motor-driven hatch arrangement 1 of a motor vehicle 2, represented in FIG. 1. The motor vehicle 2 is equipped with a central, rechargeable electrical energy-storage device which here serves for supplying an electric traction drive with power. In particular, the motor vehicle, as an electric vehicle, is propelled exclusively via the electric traction drive.

A control arrangement 3 serves for activating a motor-driven, such as electric, drive arrangement 4 assigned to the hatch arrangement 1. In the embodiment that is represented, the drive arrangement 4 has been arranged laterally on the hatch arrangement 1, the drive arrangement being here a spindle drive.

A distance sensor 5 is coupled with the control arrangement 3. By means of the distance sensor 5, sensor signals S are captured for the purpose of detecting an operator action executed by an operator B of the motor vehicle 2. Here, the distance sensor 5 is a capacitive distance sensor. Such a capacitive distance sensor can exhibit at least one electrode which extends, for instance, in the transverse direction of the motor vehicle 2.

The captured sensor signals S are representative here of information, based on a measurement of capacitance, concerning the distance of the operator B from the distance sensor 5, in which connection the sensor signals S can enable a quantification of the distance. By means of the distance sensor 5, operator movements executed here by the operator B of the motor vehicle 2 can be captured. Besides capacitive sensors, other sensors for ascertaining distance information are conceivable—for instance, radar sensors or such like.

By means of the control arrangement 3, the sensor signals S are evaluated in an evaluation routine for the purpose of detecting a specified operator action. The specified operator action can be, as represented in FIG. 1, a specified operator gesture G—here, an operator movement by means of a part of the body of the operator B. The specified operator gesture G can be a foot movement, in particular a kicking movement, of the operator B. According to one configuration which is not represented, the operator action may also have been provided in the region of a door handle of the motor vehicle 2, the distance sensor 5 having been provided in the door handle or in the region of the door handle. The operator action may be, for instance, an approach of the hand of the operator B to the door handle, or even a specified operator gesture such as a swiping movement or such like.

Operator-action criteria may have been provided for the purpose of detecting the operator action—here, the operator gesture G. In the evaluation routine the sensor signals S are examined for compliance with the operator-gesture criteria—here, by means of the control arrangement 3. Depending on the outcome of the examination, the captured operator action is, for instance, rejected as invalid or designated as a valid operator action. In the first-mentioned case, no activation of the drive arrangement 4 results. In the second-mentioned case, the drive arrangement 4 is activated by means of the control arrangement 3, as a result of which a motor-driven adjustment of the hatch arrangement 1 is brought about here.

Now it is essential that when a specified charging criterion is satisfied that represents a process of charging, external to the motor vehicle 2, of the energy-storage device the evaluation routine is carried out in a specified charging mode in which the evaluation of the sensor signals S is modified, proceeding from an evaluation according to normal operation.

With the amendment of the evaluation, in the charging mode the effect is that an operator action also continues to be detected with high reliability. In contrast to measures such as preliminary filtering for the purpose of suppressing erroneous triggering events, the evaluation routine is modified here in such a manner that a high probability of detection can also be maintained, despite the interfering influence.

An "external charging process" is understood to mean a charging process that is carried out, at least partially, via a charging device that is external to the motor vehicle 2—in the present case, by means of a charging station 6 that is coupled with the motor vehicle 2.

The evaluation of the sensor signals S in the charging mode can be carried out in the evaluation routine by applying to the sensor signals S a filter that has been specified for suppressing the interfering influence. In this case, the specified filter may have been specifically adapted to the requirements as regards an improvement of the probability of detection within the charging process.

Here, there is provision that the specified charging criterion represents a characteristic temporal progression of an interfering influence of the external charging process on the sensor signals S, and that the temporal progression of the sensor signals S is monitored for compliance with the charging criterion by means of the control arrangement 3.

A "temporal progression" in this connection is understood to mean a sequence of several temporally consecutive sensor signals S. Consequently, not only instantaneous values of the sensor signals S enter into the monitoring of the charging criterion. An exemplary temporal progression of the sensor signals S, which is associated with the start of an external charging process, is represented in FIG. 2.

The characteristic temporal progression of the interfering influence of the external charging process has its origin here in the operation of the charging station 6, and may vary, for instance depending upon the type of the charging station 6 and depending on the relative arrangement of the charging station 6 and the distance sensor 5. The interfering influence may possibly have its origin primarily in the operation of the power electronics of the charging station 6 and in interfering radiation, caused by the aforementioned operation, acting on the distance sensor 5. Further causes of an interaction of the external charging process with the sensor signals S of the distance sensor 5 are conceivable.

Figure 2:
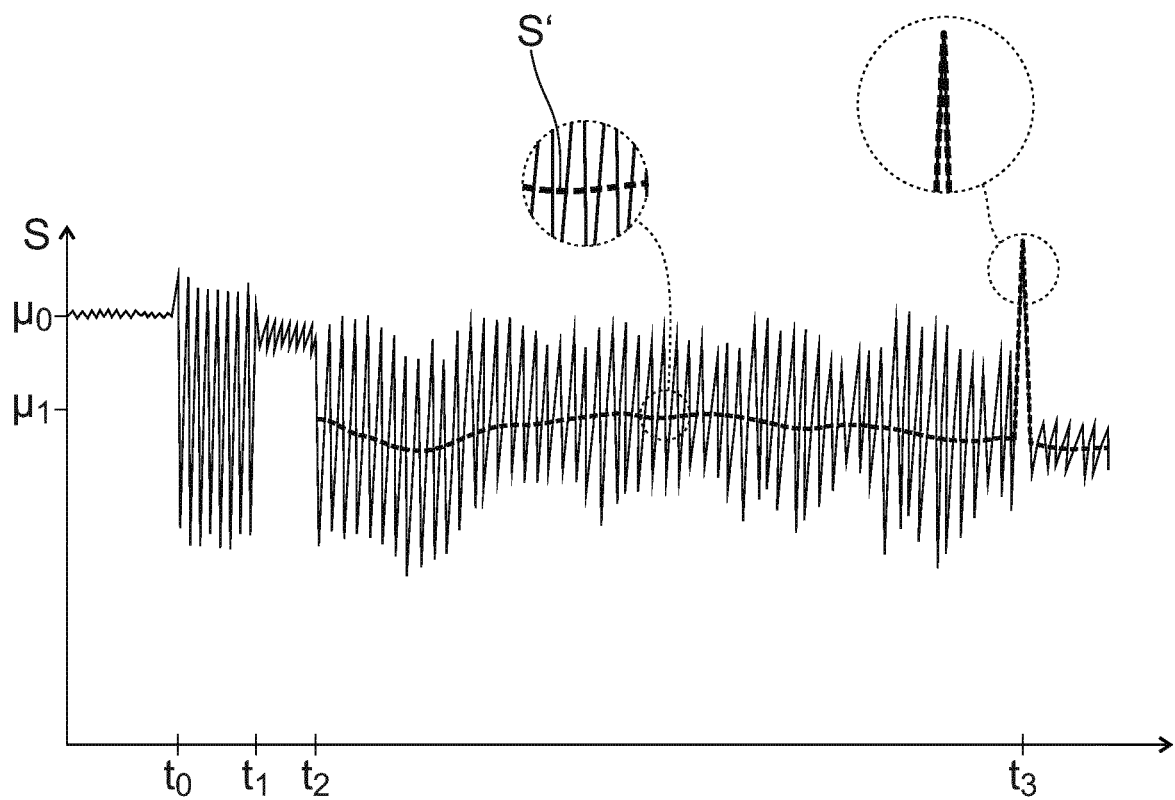
FIG. 2 shows a flowchart that shows a monitoring operation as employed in the method according to the proposal.

In the temporal progression of the sensor signals S shown in FIG. 2, at time to an activation begins via the charging station 6, which with an initialization step of the charging process up until time $t_1$ causes a distinct interfering influence on the sensor signals S, which can be detected by virtue of a strong variation of the amplitude of the sensor signals S. This is followed by a time-interval from $t_1$ until $t_2$ with slight interfering influence. Starting from time $t_2$, the actual charging process finally begins which, in turn, results in a strong variation of the amplitude of the sensor signals S.

As already mentioned, in this case it is a question of an exemplary progression of the sensor signals S, such as can be observed at a charging station 6. Other characteristics of the temporal progression are conceivable. From FIG. 2, however, it becomes clear that in the course of the charging process instantaneous values of the sensor signals S may display a variation such as also occurs in similar form in the case of other interfering influences such as radio transmitters, for instance. However, the temporal progression in the course of the initialization of the charging process is characteristic of the fact that a charging process is beginning.

In FIG. 2, in addition the temporal progression is shown of the sensor signals S' filtered with the filter that has been specified for suppressing the interfering influence. The focus here, in particular, is on largely suppressing the interfering influence without significantly changing the sensor signals S observed with the actuating action. In some embodiments, the filter that has been specified for suppressing the interfering influence have been provided in combination, in particular in cascaded manner, with at least one preliminary filter provided in accordance with normal operation. The filter may be subordinate to the preliminary filters, for instance in the charging mode. Different variants are conceivable for the preliminary filter—for instance, low-pass, high-pass and combinations thereof, as well as, in particular, adaptive (noise) filters. It is also conceivable that preliminary filters provided for the purpose of suppressing erroneous triggering events—for instance, adaptive noise filters for the purpose of suppressing broadcast signals—are modified or eliminated in the charging mode.

The charging criterion can include at least one subcriterion directed toward an amplitude value of the temporal progression of the sensor signals S and/or at least one subcriterion directed toward a frequency value of the temporal progression of the sensor signals S. In the exemplary temporal progression from FIG. 2, the characteristic interfering influence that is present here can consequently be captured in straightforward manner, for instance via the temporal sequence of strong variation ($t_0$ to $t_1$), slight variation ($t_1$ to $t_2$), strong variation (as from $t_2$) for the amplitude, and/or via a corresponding sequence in the frequency domain.

According to a further configuration, a subcriterion directed toward the amplitude value relates to an average value—in particular, a moving average—of the temporal progression of the sensor signals S. Depending upon the interfering influence of the external charging process, once again different variants are conceivable here. In the temporal progression shown in FIG. 2, a temporal offset, for instance, of the average value of the amplitude values is observed. The average value—in particular, a moving arithmetic average—prior to the charging process (before to) in this case differs distinctly from the average value $\mu_1$ starting from the beginning of the charging process (after $t_2$), which in turn is to be attributed to an interfering influence that is characteristic of the charging process. This subcriterion can be defined by the condition that the average value of the temporal progression of the sensor signals S exceeds a specified temporal offset.

According to a further configuration, the transfer function of the filter that has been specified for suppressing the interfering influence can be specified by means of the control arrangement 3 in a manner contingent upon the temporal progression of the sensor signals S when the charging criterion is satisfied. In this case, it is conceivable that a compilation of specified filters has been stored in the control arrangement 3, and one or more filters is/are selected for the charging mode, depending upon the observed temporal progression. In a configuration that is particularly easy to put into effect, the transfer function can be specified in a manner contingent upon the compliance with the subcriterion directed toward an amplitude value and/or frequency value of the temporal progression of the sensor signals S.

The filter that has been specified for suppressing the interfering influence may contain, in particular, a bandpass filter and/or a non-linear filter. For instance, the frequency characteristic of the bandpass filter is set in a manner contingent upon the compliance with a subcriterion relating to the frequency value.

The specified filter can bring about a suppression of the interfering influence for sensor signals S in a manner contingent upon a statistical quantity—in particular, the temporal variance, the standard deviation or such like—of the sensor signals S that is characteristic of the operator action. Here, the specified filter brings about a suppression of the interfering influence for sensor signals S having a statistical quantity—in particular, the temporal variance—below a specified threshold value. For instance, the sensor signals S having slight variance, as shown in FIG. 2, are smoothed, whereas sensor signals S having a variance above a threshold value undergo a slight attenuation or no attenuation. In FIG. 2 at time $t_3$, a progression of the sensor signals S that originates from an operator action is shown in exemplary manner. For instance, the variance arising within time-interval $t_0$ to $t_1$ is utilized in order to establish a threshold value for the variance that is suitable for subsequent suppression of the interfering influence. It is conceivable, furthermore, that further filters—for instance, one or more low-pass filters—have been provided for sensor signals S having a statistical quantity above the threshold value.

As already mentioned, in the evaluation routine the sensor signals S are monitored for compliance with a specified detection criterion, which here includes the operator-action criteria, for the purpose of detecting the specified operator action. Upon compliance with the detection criterion, the specified operator action is deemed to be detected. According to a further configuration, there is now provision that the detection criterion in the charging mode is modified, proceeding from a detection criterion according to normal operation for the purpose of suppressing the interfering influence. The detection of the operator action can accordingly be adapted here to the boundary conditions within the charging process, in order to guarantee a high probability of detection.

According to a further configuration, the charging process is classified by means of the control arrangement 3 on the basis of the temporal progression of the sensor signals S when the charging criterion is satisfied. For instance, a compilation of different classes of a charging process—for instance, of different types of charging stations 6—has been specified, in which case the control arrangement 3 classifies the present charging process in one of the classes. The evaluation of the sensor signals S in the charging mode is amended in a manner contingent upon the classification of the charging process. The filter that has been specified for suppressing the interfering influence can be specified in a manner contingent upon the classification. Here, differing types of filter have been provided for different classes, so the filter may, for instance, have been configured specifically for the respective type of charging station 6.

According to a further configuration, not represented here, with the external charging process a state-of-charge signal is communicated to the control arrangement 3 by means of a control unit of the motor vehicle 2, such as by means of the central control system of the motor vehicle. The control unit can, for instance, communicate with the charging station 6 in order to detect a charging process. Likewise, the control unit can infer a charging process on the basis of the operation of a charging device of the motor vehicle 2 and/or on the basis of a state of charge of the energy-storage device. The state-of-charge signal is communicated here to the control arrangement 3 via a local communication network of the motor vehicle 2, such as via a LIN bus. The charging criterion can be defined at least partially by the condition that the state-of-charge signal is available to the control arrangement 3. In one configuration, the charging mode can consequently be triggered by means of the control unit.

The detection of the charging process on the basis of the temporal progression of the sensor signals S can also be checked for plausibility via the state-of-charge signal. For instance, the charging mode is assumed only if, in addition to the detection of the charging process on the basis of the temporal progression of the sensor signals S, the state-of-charge signal is present. The state-of-charge signal can, for instance, also be interrogated by means of the control arrangement 3 if the charging criterion has been satisfied.

According to an alternative configuration, however, the method according to the proposal manages without such a state-of-charge signal, so the control arrangement 3 itself detects the charging process on the basis of the sensor signals S. By this means, an adaptation of the control unit and of the communication network of the motor vehicle 2 can be dispensed with.

The external charging process is carried out here by means of a DC charging station, the interfering influences of which have proved to be particularly appreciable. By means of the DC charging station, in particular a fast charging of the energy-storage device is carried out, for instance with a power output of more than 22 kW. A charging process by means of an AC charging station is, however, likewise conceivable.

With the motor-driven adjustment of the hatch arrangement 1, here, a transfer of the hatch arrangement 1 between a closed position represented in FIG. 1 and an open position, not shown, is carried out. The drive arrangement of a hatch 7 has been assigned to the hatch arrangement 1. With respect to the possible configuration of the hatch 7, reference is made to the introductory statements. It is likewise conceivable that other elements of the hatch arrangement 1 are adjusted in motor-driven manner upon detection of the operator action. An example of this is an adjustment of the window pane in the course of the opening of hatches 7, for instance for frameless window panes, such an adjustment being triggered by means of a distance sensor 6 in or on the door handle.

According to a further teaching, the control arrangement 3, which has been set up for the implementation of the method according to the proposal, is provided as such. In various embodiments, software that has been designed for the implementation of the method according to the proposal runs on the control arrangement 3. Reference is made to all the statements relating to the method according to the proposal.

According to a further teaching, the hatch arrangement 1 is provided as such, the hatch arrangement 1 exhibiting a drive arrangement 4, such as assigned to the hatch 7, and a control arrangement 3 according to the proposal. In this respect, too, reference is made to all the statements relating to the method according to the proposal.

The invention claimed is:

1. A method for activating a motor-driven hatch arrangement of a motor vehicle, wherein the motor vehicle is equipped with a central, rechargeable electrical energy-storage device,
   wherein a control arrangement, for activating a motor-driven drive arrangement assigned to the hatch arrangement, and a distance sensor, coupled with the control arrangement, are provided, wherein sensor signals are captured by the distance sensor for the purpose of detecting an operator action executed by an operator of the motor vehicle,
   wherein the sensor signals are evaluated in an evaluation routine by the control arrangement for the purpose of detecting a specified operator action, and upon detection of the specified operator action the drive arrangement is activated by the control arrangement,
   wherein when a specified charging criterion, which represents a process of charging, external to the motor vehicle, of the energy-storage device, is satisfied, the evaluation routine is carried out by the control arrangement in a specified charging mode in which the evaluation of the sensor signals is modified, proceeding from an evaluation according to normal operation.

2. The method as claimed in claim 1, wherein the evaluation of the sensor signals in the charging mode is carried out in the evaluation routine by applying to the sensor signals a filter that has been specified for suppressing the interfering influence.

3. The method as claimed in claim 1, wherein the specified charging criterion represents a characteristic temporal progression of an interfering influence of the external charging process on the sensor signals, and wherein by the control arrangement the temporal progression of the sensor signals is monitored for compliance with the charging criterion.

4. The method as claimed in claim 3, wherein the charging criterion includes at least one subcriterion directed toward an amplitude value of the temporal progression of the sensor signals and/or at least one subcriterion directed toward a frequency value of the temporal progression of the sensor signals.

5. The method as claimed in claim 4, wherein a subcriterion directed toward the amplitude value relates to an average value of the temporal progression of the sensor signals.

6. The method as claimed in claim 2, wherein the transfer function of the filter that has been specified for suppressing the interfering influence is specified by the control arrangement in a manner contingent upon the temporal progression of the sensor signals when the charging criterion is satisfied.

7. The method as claimed in claim 2, wherein the filter that has been specified for suppressing the interfering influence brings about a suppression of the interfering influence for sensor signals in a manner contingent upon a statistical quantity of the sensor signals that is characteristic of the operator action.

8. The method as claimed in claim 1, wherein in the evaluation routine the sensor signals are monitored for compliance with a specified detection criterion for the purpose of detecting the specified operator action, and upon compliance with the detection criterion the specified operator action is deemed to be detected, and wherein the detection criterion is modified in the charging mode, proceeding from a detection criterion according to normal operation.

9. The method as claimed in claim 2, wherein by the control arrangement the charging process is classified on the basis of the temporal progression of the sensor signals when the charging criterion is satisfied, and wherein the evaluation of the sensor signals in the charging mode is amended in a manner contingent upon the classification of the charging process.

10. The method as claimed in claim 1, wherein with the external process of charging of the control arrangement a state-of-charge signal is communicated by a control unit of the motor vehicle and wherein the charging criterion is defined at least partially by the condition that the state-of-charge signal is available to the control arrangement.

11. The method as claimed in claim 1, wherein the external charging process is carried out by a DC charging station.

12. The method as claimed in claim 1, wherein with the motor-driven adjustment of the hatch arrangement a transfer of the hatch arrangement between a closed position and an open position is carried out.

13. A control arrangement for implementing a method as claimed in claim 1.

14. A hatch arrangement with a hatch, the hatch arrangement exhibiting a drive arrangement and a control arrangement as claimed in claim 13.

15. The method as claimed in claim 2, wherein the filter that has been specified for suppressing the interfering influence is provided in combination with at least one preliminary filter provided in accordance with normal operation, and/or with modification of a preliminary filter.

16. The method as claimed in claim 5, wherein this subcriterion is defined by the condition that the average value of the temporal progression of the sensor signals exceeds a specified temporal offset.

17. The method as claimed in claim 6, wherein the transfer function is specified in a manner contingent upon the compliance with the subcriterion directed toward an amplitude value and/or frequency value of the temporal progression of the sensor signals.

18. The method as claimed in claim 7, wherein the specified filter brings about a suppression of the interfering influence for sensor signals having a statistical quantity below a specified threshold value.

19. The method as claimed in claim 9, wherein the filter that has been specified for suppressing the interfering influence is specified in a manner contingent upon the classification.

20. The method as claimed in claim 1, wherein with the external process of charging of the control arrangement a state-of-charge signal is communicated by a control unit of the motor vehicle by the central control system of the motor vehicle, and wherein the charging criterion is defined at least partially by the condition that the state-of-charge signal is available to the control arrangement.

* * * * *